(12) United States Patent
Wakamiya et al.

(10) Patent No.: US 7,141,879 B2
(45) Date of Patent: Nov. 28, 2006

(54) SEMICONDUCTOR DEVICE

(75) Inventors: Keiichiro Wakamiya, Tokyo (JP); Satoshi Yamada, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 417 days.

(21) Appl. No.: 09/818,906

(22) Filed: Mar. 28, 2001

(65) Prior Publication Data
US 2002/0041013 A1    Apr. 11, 2002

(30) Foreign Application Priority Data
Oct. 10, 2000    (JP) .............................. 2000-308740

(51) Int. Cl.
*H01L 23/48* (2006.01)
*H01L 23/52* (2006.01)
*H01L 29/40* (2006.01)

(52) U.S. Cl. .................. 257/750; 257/738; 257/780; 257/778; 257/758

(58) Field of Classification Search ................ 257/737, 257/738, 780, 787–789, 690, 750, 700, 736, 257/748, 758, 778; 438/614, 615
See application file for complete search history.

(56) References Cited

U.S. PATENT DOCUMENTS

| | | | |
|---|---|---|---|
| 5,134,460 A * | 7/1992 | Brady et al. ................... 357/71 |
| 5,600,180 A * | 2/1997 | Kusaka et al. ............. 257/692 |
| 5,641,996 A * | 6/1997 | Omoya et al. .............. 257/787 |
| 5,757,078 A * | 5/1998 | Matsuda et al. ............. 257/737 |
| 5,866,920 A * | 2/1999 | Matsumoto et al. .......... 257/63 |
| 5,886,415 A * | 3/1999 | Akagawa ..................... 257/789 |
| 5,952,718 A * | 9/1999 | Ohtsuka et al. ............. 257/737 |
| 5,981,313 A * | 11/1999 | Tanaka ........................ 438/118 |
| 6,159,837 A * | 12/2000 | Yamaji et al. .............. 438/613 |
| 6,181,569 B1 * | 1/2001 | Chakravorty ................ 361/761 |
| 6,436,802 B1 * | 8/2002 | Khoury ....................... 438/612 |

FOREIGN PATENT DOCUMENTS

JP    10-50772    2/1998

* cited by examiner

*Primary Examiner*—Nitin Parekh
(74) *Attorney, Agent, or Firm*—McDermott Will & Emery LLP

(57) ABSTRACT

There is described an improved semiconductor device of chip-scale package (CSP) comprising posts provided on respective electrode pads of a semiconductor chip, and solder balls which are provided on the respective posts as external terminals after the semiconductor chip has been encapsulated with resin while the posts are held in a projecting manner. The semiconductor device prevents occurrence of cracks, which would otherwise be caused by stress which is induced by a difference in coefficient of linear expansion between the semiconductor chip and the sealing resin and is imposed on the posts. In order to alleviate the stress imposed on the posts, a stress-absorbing layer formed from a metal layer having a low Young's modulus, such as gold (Au) or palladium (Pd), is interposed in the middle of each of the posts.

6 Claims, 3 Drawing Sheets

SEMICONDUCTOR DEVICE

BACKGROUND OF THE INVENTION

1. Field of the Invention

In association with miniaturization of and a reduction in the profile of an electronic component using an LSI, demand has recently arisen for miniaturizing an LSI package. A chip-scale package (CSP), which is identical in size with a semiconductor chip, has been developed.

2. Background Art

CSPs are classified into two types; that is, a CSP comprising a semiconductor chip electrically and mechanically connected to a printed board and a film carrier, with solder balls (bumps) being provided on the printed board and the film carrier as external terminals; and a CSP having neither a printed board nor a film carrier and comprising posts provided on respective electrode pads of a semiconductor chip, with solder balls being provided on the respective posts as external terminals after the semiconductor chip has been encapsulated with resin while the posts are held in a projecting manner.

FIG. 3 is a cross-sectional view of a conventional CSP of the latter type, wherein reference numeral 1 designates a semiconductor chip; 2 designates an electrode pad; 3 designates a protective dielectric layer; 4 designates a post as a connecting conductor; 5 designates sealing resin; 6 designates a bump as an external terminal; and 7 designates a coating layer.

The CSP of latter type does not use any printed board or a film carrier for effecting plastic encapsulation or forming external terminals and hence is advantageous over a CSP of the former type.

Because of a difference in coefficient of linear expansion between the semiconductor chip 1 and the sealing resin 5, the conventional CSP of latter type encounters a structural problem of cracks being caused by a stress imposed on the posts 4.

SUMMARY OF THE INVENTION

The present invention has been conceived to solve such a drawback of the background art and is aimed at providing an improved semiconductor device which can prevent occurrence of cracks.

The present invention provides a semiconductor device comprising a semiconductor chip and a protective insulating layer covering the surface of the semiconductor chip. A plurality of connecting conductors is connected to the surface of the semiconductor chip and penetrating the protective insulating layer to the outside surface of the protective insulating layer. Further the connecting conductor includes a plurality of layers formed of same material and at least one of the layers is formed as a stress-absorbing layer having lower hardness than other layer.

In another aspect, in the above semiconductor device, the connecting conductor may be formed from anisotropic conductive material or conductive material containing metal particles.

According to another aspect of the present invention, there is provided a semiconductor device comprising a semiconductor chip and a protective insulating layer covering the surface of the semiconductor chip. A plurality of connecting conductors is connected to the surface of the semiconductor chip and penetrates the protective insulating layer to the outside surface of the protective insulating layer. Further the connecting conductor includes a plurality of layers formed of different material and at least one of the layers is formed as a stress-absorbing layer having lower hardness than other layer.

In another aspect, in the above semiconductor device, the stress-absorbing layer may be formed from gold or palladium, anisotropic conductive material, or conductive material containing metal particles.

In another aspect, in each of the above semiconductor device, the connecting conductor may be formed by means of stacking the layers in a staggered manner. Further, the connecting conductor may be formed of the layers being substantially identical diameters, or differing in diameter from each other in sequence of layers.

Other and further objects, features and advantages of the invention will appear more fully from the following description.

DETAILED DESCRIPTION OF THE PREFERRED EMBODIMENTS

Figure 1:
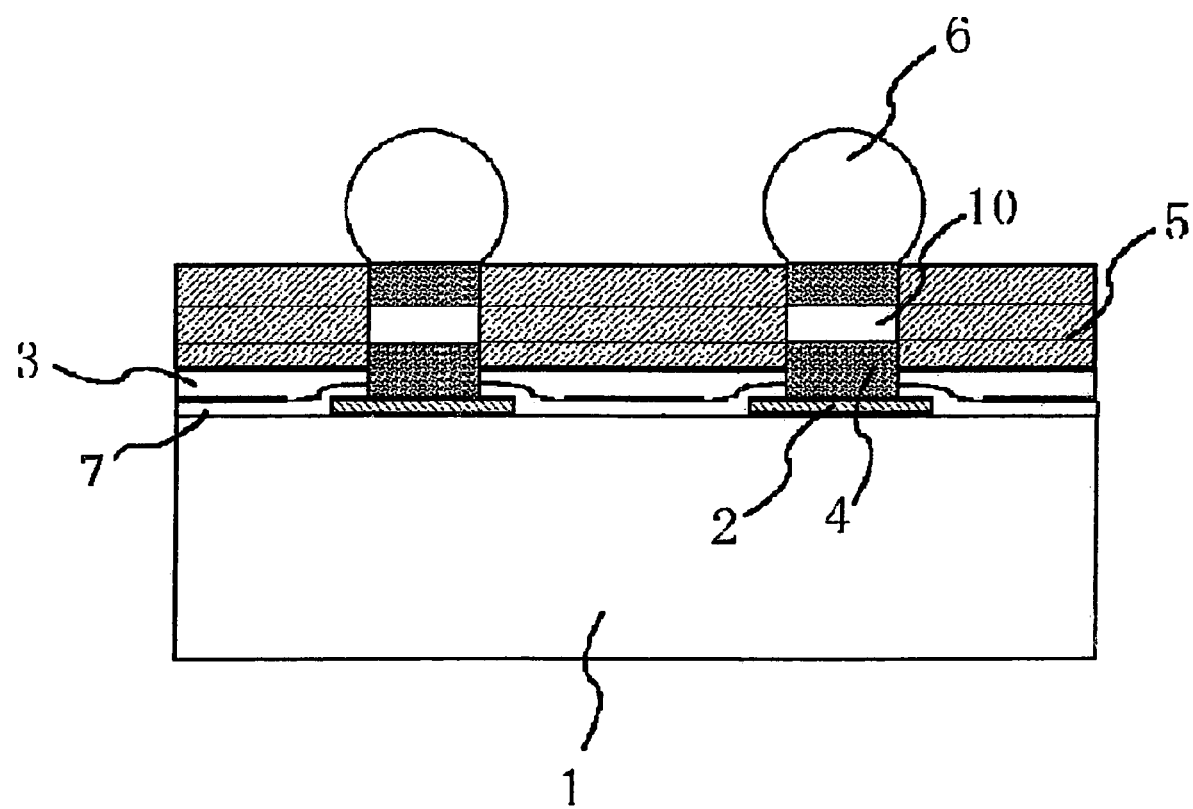
FIG. 1 is a cross-sectional view showing a semiconductor device according to a first embodiment of the present invention.

The embodiments of the present invention will be hereinafter described with reference to the accompanying drawings. In the drawings, the same or corresponding portions are given the same reference numerals and descriptions therefore may be simplified or omitted.

First Embodiment

FIG. 1 is a cross-sectional view showing a semiconductor device according to a first embodiment of the present invention.

Electrode pads 2 are provided on an element-side surface of a semiconductor chip 1 on which an integrated circuit including semiconductor elements is formed. Then electrode pads 2 are electrically connected to the integrated circuit. A protective dielectric layer 3 and a coating layer 7 are formed around the electrode pads 2 such that apertures are formed in the protective dielectric layer 3 and the coating layer 7 so as to match the respective electrode pads 2. A post 4 as a connecting conductor is formed on each of the electrode pads 2 and includes a plurality of layers formed of same or different material, and at least one of the layers is formed as a stress-absorbing layer having lower hardness than other layer.

A stress-absorbing layer 10 is provided at the middle of the post 4. For example, a metal layer having a low Young's modulus, such as gold (Au) or palladium (Pd); anisotropic conductive material; or conductive material containing metal particles such as Au paste may be used as the stress-absorbing layer 10. Alternatively, the post 4 may be formed from a single type of metal while the hardness of the metal material is changed through use of different manufacturing methods.

As an example of a manufacturing method, a lower layer of the post 4 is formed on the electrode pad 2 by plating through a hole in a resist layer (not shown), and then a lower layer of the sealing resin 5 is formed in the same height after removing the resist layer. Then, the stress-absorbing layer 10 is formed on the lower layer of the post 4 by plating through a hole in another resist layer (not shown), and a middle layer of the sealing resin 5 is formed in the same height after removing the resist layer. Further, an upper layer of the post 4 is formed on the stress-absorbing layer 10 by plating through a hole in another resist layer (not shown), and an upper layer of the sealing resin 5 is formed in the same height after removing the resist layer. Thus, the sealing resin 5 is formed around respective layer of the posts 4 so as to cover the posts 4.

The protective dielectric layer 3 and the sealing resin 5 and the coating layer 7 constitute a protective insulating layer in the stacked fashion in which the posts 4 penetrate.

Further, bumps 6 as external terminals are mechanically and electrically connected to the upper surface of each of the posts 4.

As mentioned above, in the semiconductor device according to the first embodiment, the stress-absorbing layer 10 is provided in the middle of each of the posts 4, thereby alleviating the stress imposed on the posts 4.

Second Embodiment

Figure 2A:
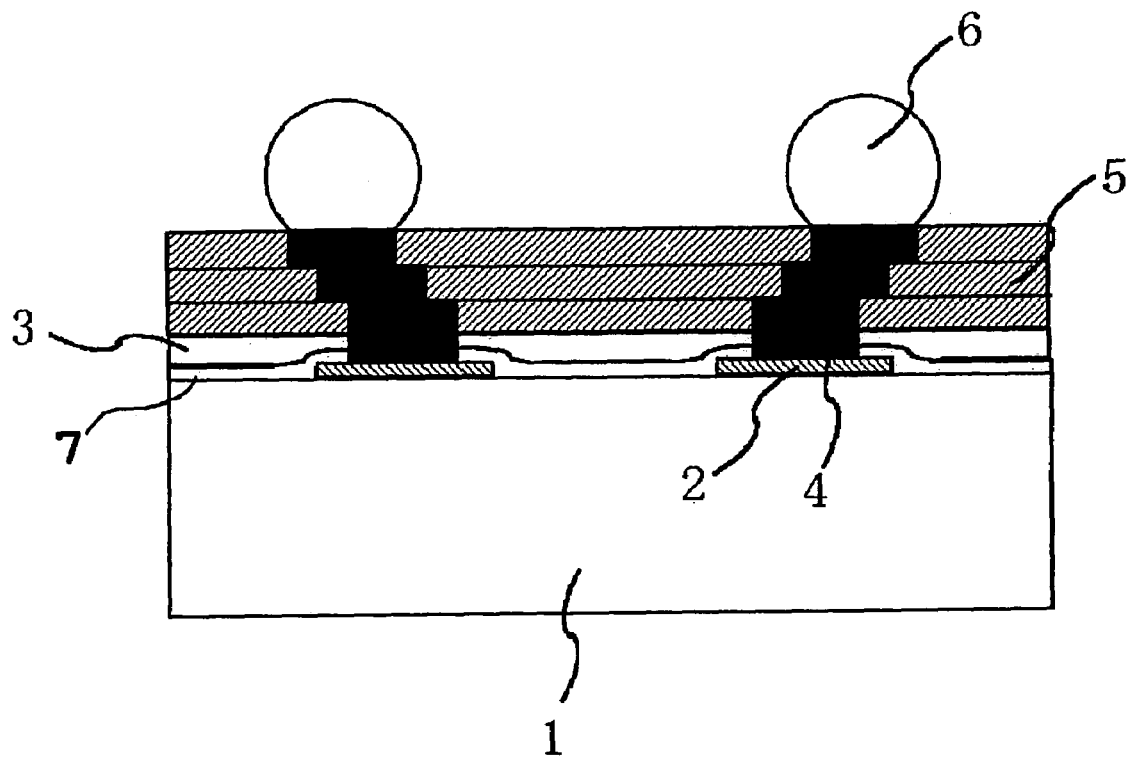
FIGS. 2A and 2B are cross-sectional views showing a semiconductor device according to a second embodiment of the present invention.
Figure 2B:
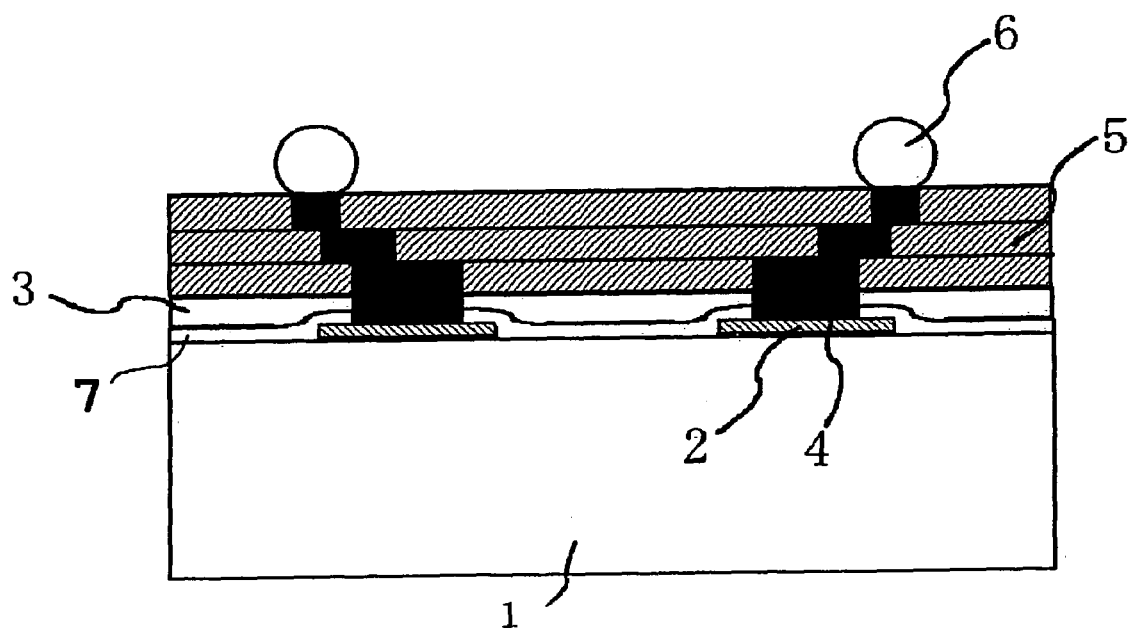
Figure 3:
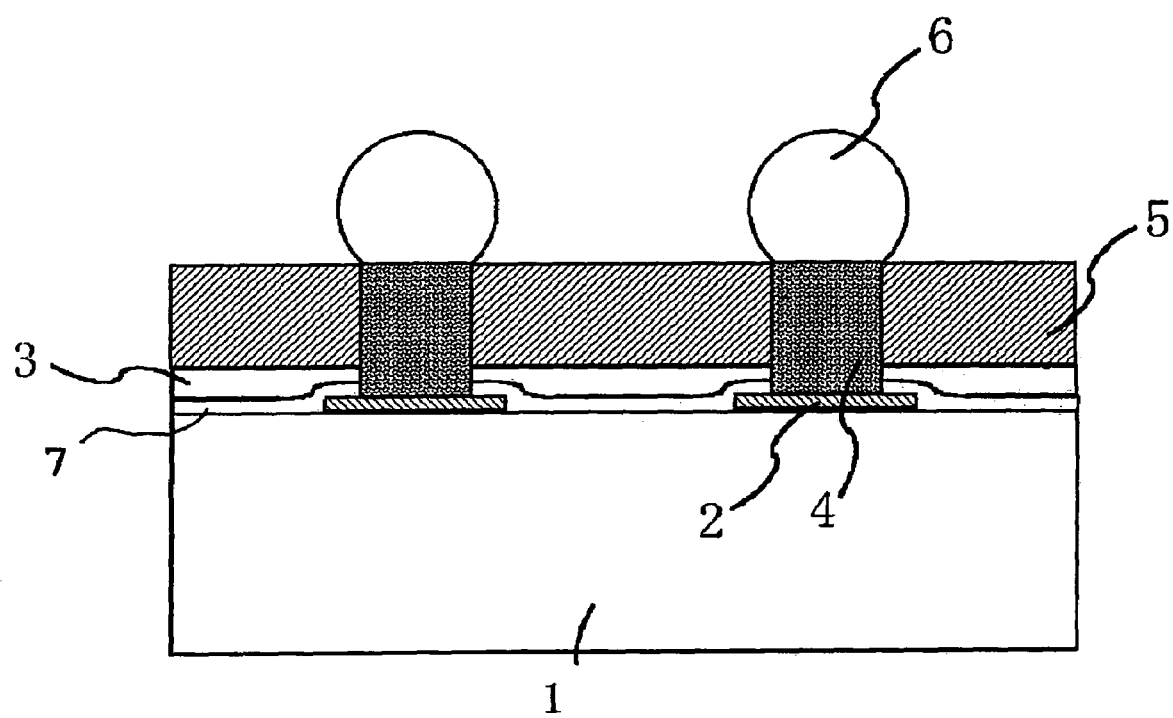
FIG. 3 is a cross-sectional view of a conventional CSP.

FIGS. 2A and 2B are cross-sectional views showing a semiconductor device according to a second embodiment of the present invention.

The electrode pads 2 are provided on the element-side surface of the semiconductor chip 1 on which an integrated circuit including semiconductor elements is formed. Then electrode pads 2 are electrically connected to the integrated circuit. The protective dielectric layer 3 and the coating layer 7 are formed around the electrode pads 2 such that apertures are formed in the protective dielectric layer 3 and the coating layer 7 so as to match the respective electrode pads 2.

A post 4 as a connecting conductor is formed on each of the electrode pads 2. The sealing resin 5 is formed around respective layer of the posts 4 so as to cover the posts 4.

More specifically, each of the posts 4 is divided into three layers, and the thus-divided layers are stacked in a staggered manner, to thereby alleviate the stress imposed on the posts 4. As shown in FIG. 2A, the posts 4 formed in each of the sealing resin layers 5 may assume identical diameters. Alternatively, as shown in FIG. 2B, the posts 4 formed in respective sealing resin layers 5 may assume different diameters. The dielectric layer 3 and the sealing resin layers 5 and the coating layer 7 constitute a protective insulating layer in that the posts 4 penetrate to the outside surface. The bump (external terminal) 6 is mechanically and electrically connected to the upper surface of each of the posts 4.

As mentioned above, in the semiconductor device according to the second embodiment, the posts 4 are formed in a split and staggered manner, thereby alleviating stress imposed on the posts 4.

Since the present invention has been embodied in the manner as mentioned above, the invention yields the following advantages.

A semiconductor device comprises a semiconductor chip and a protective insulating layer covering the surface of the semiconductor chip. A plurality of connecting conductors is connected to the surface of the semiconductor chip and penetrating the protective insulating layer to the outside surface of the protective insulating layer. Further the connecting conductor includes a plurality of layers formed of same or different material and at least one of the layers is formed as a stress-absorbing layer having lower hardness than other layer. Hence, stress imposed on the posts can be alleviated.

In another aspect, a semiconductor device comprises the connecting conductor formed by means of stacking the layers in a staggered manner. Hence, stress imposed on the posts can be alleviated.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2000-308740, filed on Oct. 10, 2000 including specification, claims, drawings and summary, on which the Convention priority of the present application is based, are incorporated herein by reference in its entirety.

What is claimed is:

1. A semiconductor device comprising:
   a semiconductor chip,
   a protective insulating layer comprising a coating layer covering the surface of the semiconductor chip;
   a plurality of connecting conductors connected to the surface of the semiconductor chip and penetrating the coating layer beyond the outside surface of the coating layer, wherein the connecting conductors are connected to bumps as external terminals beyond the outside surface of the coating layer, and wherein the connecting conductors do not include wiring layers and the bumps;
   wherein the connecting conductor includes a plurality of layers formed of same material and at least one of the layers is formed as a stress-absorbing layer having lower hardness than other layer.

2. The semiconductor device according to claim 1, wherein said connecting conductor is formed from anisotropic conductive material.

3. The semiconductor device according to claim 1, wherein said connecting conductor is formed from conductive material containing metal particles.

4. The semiconductor device according to claim 1, wherein said connecting conductor is formed by means of stacking a plurality of layers in a staggered manner.

5. The semiconductor device according to claim 4, wherein said plurality of layers of the connecting conductor are formed in substantially identical diameter.

6. The semiconductor device according to claim 4, wherein said plurality of layers of the connecting conductor are formed in different diameters from each other in sequence of layers.

* * * * *